(12) United States Patent
Xu et al.

(10) Patent No.: US 12,090,599 B2
(45) Date of Patent: Sep. 17, 2024

(54) DETERMINATION OF SUBSTRATE LAYER THICKNESS WITH POLISHING PAD WEAR COMPENSATION

(71) Applicant: Applied Materials, Inc., Santa Clara, CA (US)

(72) Inventors: Kun Xu, Sunol, CA (US); Benjamin Cherian, San Jose, CA (US); Jun Qian, Sunnyvale, CA (US); Kiran Lall Shrestha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/365,527

(22) Filed: Aug. 4, 2023

(65) Prior Publication Data

US 2023/0381912 A1    Nov. 30, 2023

Related U.S. Application Data

(62) Division of application No. 17/344,779, filed on Jun. 10, 2021, now Pat. No. 11,780,047.

(Continued)

(51) Int. Cl.
*B24B 37/00* (2012.01)
*B24B 37/013* (2012.01)
(Continued)

(52) U.S. Cl.
CPC ........ *B24B 37/013* (2013.01); *G05B 19/4188* (2013.01); *G06N 3/045* (2023.01);
(Continued)

(58) Field of Classification Search
CPC ................ B24B 37/013; B24B 37/005; B24B 49/105; G06N 3/08; G06N 20/00; G06N 3/063;
(Continued)

(56) References Cited

U.S. PATENT DOCUMENTS 5,433,651 A   7/1995 Lustig
5,559,428 A   9/1996 Li et al.
(Continued)

FOREIGN PATENT DOCUMENTS

CN    1860584      11/2006
CN    201166564    12/2008
(Continued)

OTHER PUBLICATIONS

Office Action in Chinese Appln. No. 202180012632.8, dated Jun. 10, 2023, 12 pages (with English translation).
(Continued)

*Primary Examiner* — Katina N. Henson
(74) *Attorney, Agent, or Firm* — Fish & Richardson P.C.

(57) ABSTRACT

A method of training a neural network includes obtaining two ground truth thickness profiles a test substrate, obtaining two thickness profiles for the test substrate as measured by an in-situ monitoring system while the test substrate is on polishing pads of different thicknesses, generating an estimated thickness profile for another thickness value that is between the two thickness values by interpolating between the two profiles, and training a neural network using the estimated thickness profile.

13 Claims, 8 Drawing Sheets

Related U.S. Application Data

(60) Provisional application No. 63/043,716, filed on Jun. 24, 2020.

(51) Int. Cl.
| | |
|---|---|
| *G05B 19/418* | (2006.01) |
| *G06N 3/045* | (2023.01) |
| *G06N 3/08* | (2023.01) |
| *H01L 23/00* | (2006.01) |

(52) U.S. Cl.
CPC .............. *G06N 3/08* (2013.01); *H01L 23/00* (2013.01); *G05B 2219/32335* (2013.01)

(58) Field of Classification Search
CPC .................. G06N 3/0454; G06N 3/084; H01L 21/67253; H01L 21/67092; H01L 22/20; G05B 19/042; G05B 19/048; G05B 19/4063; G05B 2219/33034; G05B 2219/45031; G05B 2219/32335; G05B 13/027; G05B 19/4188
USPC ............................................................. 451/5
See application file for complete search history.

(56) References Cited

U.S. PATENT DOCUMENTS

| | | | |
|---|---|---|---|
| 5,644,221 A | 7/1997 | Li et al. | |
| 5,660,672 A | 8/1997 | Li et al. | |
| 5,700,180 A | 12/1997 | Sandhu et al. | |
| 5,832,466 A | 11/1998 | Feldgajer | |
| 6,004,187 A | 12/1999 | Nyui et al. | |
| 6,072,313 A | 6/2000 | Li et al. | |
| 6,159,073 A | 12/2000 | Wiswesser et al. | |
| 6,172,756 B1 | 1/2001 | Geels et al. | |
| 6,179,709 B1 | 1/2001 | Redeker et al. | |
| 6,190,234 B1 | 2/2001 | Swedek et al. | |
| 6,280,289 B1 | 8/2001 | Wiswesser et al. | |
| 6,296,548 B1 | 10/2001 | Wiswesser et al. | |
| 6,399,501 B2 | 6/2002 | Birang et al. | |
| 6,407,546 B1 | 6/2002 | Le et al. | |
| 6,433,541 B1 | 8/2002 | Lehman et al. | |
| 6,524,165 B1 | 2/2003 | Wiswesser et al. | |
| 6,558,229 B2 | 5/2003 | Kimura et al. | |
| 6,594,024 B1 | 7/2003 | Singh et al. | |
| 6,602,724 B2 | 8/2003 | Redeker et al. | |
| 6,707,540 B1 | 3/2004 | Lehman et al. | |
| 6,924,641 B1 | 8/2005 | Hanawa et al. | |
| 6,945,845 B2 | 9/2005 | Bennett et al. | |
| 6,975,107 B2 | 12/2005 | Hanawa et al. | |
| 7,001,243 B1 | 2/2006 | Yi et al. | |
| 7,008,296 B2 | 3/2006 | Swedek et al. | |
| 7,016,795 B2 | 3/2006 | Swedek et al. | |
| 7,025,658 B2 | 4/2006 | David | |
| 7,097,537 B1 | 8/2006 | David | |
| 7,112,960 B2 | 9/2006 | Miller et al. | |
| 7,082,345 B2 | 12/2006 | Shanmugasundram et al. | |
| 7,153,185 B1 | 12/2006 | Birang et al. | |
| 7,189,140 B1 | 3/2007 | Shugrue et al. | |
| 8,010,222 B2 | 8/2011 | Lehman et al. | |
| 8,106,651 B2 | 1/2012 | Lahiri et al. | |
| 8,246,417 B2 | 8/2012 | Kobayashi et al. | |
| 8,284,560 B2 | 10/2012 | Iravani et al. | |
| 8,367,429 B2 | 2/2013 | Lee et al. | |
| 8,408,965 B2 | 4/2013 | Bennett et al. | |
| 9,142,466 B2 | 9/2015 | Lee et al. | |
| 9,205,527 B2 | 12/2015 | Xu et al. | |
| 9,281,253 B2 | 3/2016 | Xu et al. | |
| 9,490,186 B2 | 11/2016 | Benvegnu et al. | |
| 9,636,797 B2 | 5/2017 | Xu et al. | |
| 10,478,937 B2 | 11/2019 | Tang et al. | |
| 10,921,789 B2 | 2/2021 | Kadokura | |
| 10,994,389 B2 | 5/2021 | Xu et al. | |
| 11,524,382 B2 | 12/2022 | Xu et al. | |
| 11,580,375 B2 | 2/2023 | Bhaskar et al. | |
| 11,618,499 B2 | 4/2023 | Bouchet | |
| 11,780,047 B2 | 10/2023 | Xu et al. | |
| 2001/0008827 A1 | 7/2001 | Kimura et al. | |
| 2002/0002029 A1 | 1/2002 | Kimura et al. | |
| 2002/0013007 A1 | 1/2002 | Hasegawa et al. | |
| 2002/0013124 A1 | 1/2002 | Tsujimura et al. | |
| 2002/0055192 A1 | 5/2002 | Redeker et al. | |
| 2002/0077031 A1 | 6/2002 | Johansson et al. | |
| 2002/0098777 A1 | 7/2002 | Laursen et al. | |
| 2002/0103564 A1 | 8/2002 | Fielden et al. | |
| 2002/0155789 A1 | 10/2002 | Bibby, Jr. et al. | |
| 2002/0164925 A1 | 11/2002 | Swedek et al. | |
| 2002/0192966 A1 | 12/2002 | Shanmugasundram et al. | |
| 2003/0028279 A1 | 2/2003 | Wang et al. | |
| 2003/0053042 A1 | 3/2003 | Chen | |
| 2003/0087459 A1 | 5/2003 | Laursen et al. | |
| 2004/0119468 A1 | 6/2004 | Gotkis et al. | |
| 2004/0259470 A1 | 12/2004 | Swedek et al. | |
| 2005/0018183 A1 | 1/2005 | Shortt | |
| 2005/0024047 A1 | 2/2005 | Miller et al. | |
| 2006/0009132 A1 | 1/2006 | Bennett et al. | |
| 2007/0061036 A1 | 3/2007 | Sakurai et al. | |
| 2007/0103150 A1 | 5/2007 | Tada et al. | |
| 2007/0205765 A1 | 9/2007 | Bailey | |
| 2007/0251922 A1 | 11/2007 | Swedek et al. | |
| 2008/0057830 A1 | 3/2008 | Molnar | |
| 2008/0139087 A1 | 6/2008 | Togawa et al. | |
| 2008/0183312 A1 | 7/2008 | Funk et al. | |
| 2009/0104847 A1 | 4/2009 | Kobayashi et al. | |
| 2009/0156098 A1 | 6/2009 | Swedek et al. | |
| 2009/0263918 A1 | 10/2009 | Lahiri et al. | |
| 2009/0299930 A1 | 12/2009 | Konermann et al. | |
| 2010/0099334 A1 | 4/2010 | Bennett et al. | |
| 2011/0124269 A1 | 5/2011 | Tada et al. | |
| 2011/0189925 A1 | 8/2011 | Iravani et al. | |
| 2011/0318992 A1 | 12/2011 | David et al. | |
| 2012/0034845 A1 | 2/2012 | Hu et al. | |
| 2012/0064800 A1 | 3/2012 | Watanabe et al. | |
| 2012/0276661 A1 | 11/2012 | Iravani et al. | |
| 2013/0000845 A1 | 1/2013 | Lu et al. | |
| 2013/0273812 A1 | 10/2013 | Qian et al. | |
| 2013/0337722 A1 | 12/2013 | Namiki et al. | |
| 2015/0118765 A1 | 4/2015 | Xu et al. | |
| 2015/0118766 A1 | 4/2015 | Xu et al. | |
| 2015/0224623 A1 | 8/2015 | Xu et al. | |
| 2015/0371907 A1 | 12/2015 | Lu et al. | |
| 2015/0371913 A1 | 12/2015 | Zhefu et al. | |
| 2016/0016279 A1 | 1/2016 | Gurusamy et al. | |
| 2016/0361791 A1 | 12/2016 | Economikos et al. | |
| 2018/0056476 A1 | 3/2018 | Zhang et al. | |
| 2018/0203089 A1 | 7/2018 | Xu et al. | |
| 2018/0203090 A1 | 7/2018 | Xu et al. | |
| 2018/0304435 A1 | 10/2018 | Xu et al. | |
| 2019/0095797 A1 | 3/2019 | Dhandapani et al. | |
| 2019/0120610 A1 | 4/2019 | Wu et al. | |
| 2019/0299356 A1* | 10/2019 | Xu ........................ G06N 3/063 |
| 2020/0101579 A1 | 4/2020 | Suzuki | |
| 2020/0130136 A1 | 4/2020 | Huang et al. | |
| 2020/0398890 A1 | 12/2020 | Bouchet | |
| 2021/0229234 A1 | 7/2021 | Xu et al. | |
| 2021/0379723 A1 | 12/2021 | Xu et al. | |
| 2021/0402551 A1 | 12/2021 | Xu et al. | |
| 2023/0085787 A1 | 3/2023 | Xu et al. | |

FOREIGN PATENT DOCUMENTS

| | | |
|---|---|---|
| CN | 101978486 | 2/2011 |
| CN | 102278967 | 12/2011 |
| CN | 102398210 | 4/2012 |
| CN | 102626895 | 8/2012 |
| CN | 102683237 | 9/2012 |
| CN | 105659363 | 6/2016 |
| CN | 106625201 | 5/2017 |
| CN | 107369635 | 11/2017 |
| CN | 108573310 | 9/2018 |
| CN | 111185845 | 5/2020 |
| EP | 0738561 | 10/1996 |
| EP | 1063056 | 12/2000 |
| JP | 2004-525521 | 8/2004 |

(56) References Cited

FOREIGN PATENT DOCUMENTS

| | | |
|---|---|---|
| JP | 2005-034992 | 2/2005 |
| JP | 2005-518654 | 6/2005 |
| JP | 2007-501509 | 1/2007 |
| JP | 2007-083359 | 4/2007 |
| JP | 2007-523756 | 8/2007 |
| JP | 2009-004442 | 1/2009 |
| JP | 2009-099842 | 5/2009 |
| JP | 2011-023579 | 2/2011 |
| JP | 2011-164110 | 8/2011 |
| JP | 2012-506152 | 3/2012 |
| JP | 2014-096585 | 5/2014 |
| JP | 2016-538728 | 12/2016 |
| JP | 2017-506438 | 3/2017 |
| JP | 2019-139755 | 8/2019 |
| JP | 2021-515511 | 6/2021 |
| KR | 10-0769566 | 10/2007 |
| KR | 10-2009-0057306 | 6/2009 |
| KR | 10-2011-0084947 | 7/2011 |
| KR | 10-2016-0052216 | 5/2016 |
| KR | 10-2016-0078473 | 7/2016 |
| KR | 10-2016-0103791 | 9/2016 |
| KR | 10-2017-0015406 | 2/2017 |
| KR | 10-2020-0047739 | 5/2020 |
| TW | 393563 | 6/2000 |
| TW | I221435 | 10/2004 |
| TW | 201249598 | 12/2012 |
| TW | 201400239 | 1/2014 |
| TW | 201842471 | 12/2018 |
| TW | 201945118 | 12/2019 |
| WO | WO 1997/021070 | 6/1997 |
| WO | WO 2001/046684 | 6/1999 |
| WO | WO 2002/087825 | 11/2002 |
| WO | WO 2004/059242 | 7/2004 |
| WO | WO 2008/032753 | 1/2008 |
| WO | WO 2012/148716 | 11/2012 |
| WO | WO 2018/102222 | 6/2018 |
| WO | WO 2020/067914 | 4/2020 |

OTHER PUBLICATIONS

Zhang et al, "Artificial Neural Network Modeling For Experiments of Electrical Discharge Grinding of Polycrystalline Diamond," Diamond & Abrasives Engineering, Jun. 30, 2004, 141(3):14-16 (with English abstract).

Zheng et al., "Research on Oil Film Thickness Measuring System of the Thrust Bearing Test Board," Large Electric Machine and Hydraulic Turbine, Jan. 29, 2001, 9 pages (with English translation).

Notice of Allowance in Chinese Appln. No. 202180012632.8, dated Dec. 27, 2023, 8 pages (with English translation).

\* cited by examiner

DETERMINATION OF SUBSTRATE LAYER THICKNESS WITH POLISHING PAD WEAR COMPENSATION

CROSS-REFERENCE TO RELATED APPLICATIONS

This application is a divisional of U.S. application Ser. No. 17/344,779, filed Jun. 10, 2021, which claims priority to U.S. Application Ser. No. 63/043,716, filed on Jun. 24, 2020, the disclosure of which is incorporated by reference.

TECHNICAL FIELD

The present disclosure relates to in-situ monitoring and profile reconstruction during polishing of a substrate.

BACKGROUND

An integrated circuit is typically formed on a substrate (e.g. a semiconductor wafer) by the sequential deposition of conductive, semiconductive or insulative layers on a silicon wafer, and by the subsequent processing of the layers.

One fabrication step involves depositing a filler layer over a non-planar surface, and planarizing the filler layer until the non-planar surface is exposed. For example, a conductive filler layer can be deposited on a patterned insulative layer to fill the trenches or holes in the insulative layer. The filler layer is then polished until the raised pattern of the insulative layer is exposed. After planarization, the portions of the conductive layer remaining between the raised pattern of the insulative layer form vias, plugs and lines that provide conductive paths between thin film circuits on the substrate. In addition, planarization may be used to planarize the substrate surface for lithography.

Chemical mechanical polishing (CMP) is one accepted method of planarization. This planarization method typically requires that the substrate be mounted on a carrier head. The exposed surface of the substrate is placed against a rotating polishing pad. The carrier head provides a controllable load on the substrate to push it against the polishing pad. A polishing liquid, such as slurry with abrasive particles, is supplied to the surface of the polishing pad. In order to maintain the polishing pad in a uniform abrasive condition from wafer-to-wafer, the polishing pad is subjected to a conditioning process, e.g., abraded by an abrasive conditioner disk. Over the course of polishing multiple substrates, the polishing pad thickness can vary due to the conditioner disk wearing away the polishing pad.

During semiconductor processing, it may be important to determine one or more characteristics of the substrate or layers on the substrate. For example, it may be important to know the thickness of a conductive layer during a CMP process, so that the process may be terminated at the correct time. A number of methods may be used to determine substrate characteristics. For example, optical sensors may be used for in-situ monitoring of a substrate during chemical mechanical polishing. Alternately (or in addition), an eddy current sensing system may be used to induce eddy currents in a conductive region on the substrate to determine parameters such as the local thickness of the conductive region.

SUMMARY

In one aspect, a method of training a neural network includes obtaining a ground truth thickness profile for each test substrate of a plurality of test substrates having a different thickness profile, obtaining a first thickness value, obtaining a first measured thickness profile corresponding to the test substrate being measured by an in-situ monitoring system while on a polishing pad of a first thickness corresponding to the first thickness value for each test substrate of the plurality of test substrates, obtaining a second thickness value, obtaining a second measured thickness profile corresponding to the test substrate being measured by the in-situ monitoring system while on a polishing pad of a second thickness corresponding to the second thickness value for each test substrate of the plurality of test substrates, generating an estimated third thickness profile for a third thickness value that is between the first thickness value and the second thickness value by interpolating between the first profile for the test substrate and the second thickness profile for each test substrate of the plurality of test substrates, and training a neural network by, for each test substrate, applying the third thickness and the estimated third thickness profile to a plurality of input nodes and the ground truth thickness profile to a plurality of output nodes while the neural network is in a training mode.

In another aspect, a polishing system includes a platen to support a polishing pad, a carrier head to hold a substrate and bring the substrate into contact with the polishing pad, an in-situ monitoring system to generate a signal that depends on a thickness of a conductive layer on the substrate while the conductive layer is being polished by the polishing pad, and a controller. The controller is configured to receive a measure of a pre-polish thickness of the conductive layer, obtain an initial signal value from the in-situ monitoring system at a beginning of a polishing of the conductive layer, determine an expected signal value for the conductive layer based on the pre-polish thickness, calculate a gain based on the initial signal value and the expected signal value, determine a polishing pad thickness value from the gain using a gain function, receive signals from the in-situ monitoring system during polishing of the conductive layer to generate a plurality of measured signals for a plurality of different locations on the layer, determine a plurality of thickness values for the plurality of different locations on the layer from the plurality of measured signals, generate, a corrected thickness value for the location to provide a plurality of corrected thickness values by processing at least some of the plurality of thickness values through a neural network for each location of at least some of the plurality of different locations wherein the at least some of the plurality of thickness values and the polishing pad thickness value are input to the neural network and the corrected thickness values are output by the neural network, and at least one of detecting a polishing endpoint or modifying a polishing parameter based on the plurality of corrected thickness values.

In another aspect, a method of controlling polishing includes receiving a measure of a pre-polish thickness of a conductive layer on a substrate, bringing the conductive layer on the substrate into contact with a polishing pad in a polishing system and commencing polishing, obtaining an initial signal value from the in-situ monitoring system at a beginning of the polishing of the conductive layer, determining an expected signal value for the conductive layer based on the pre-polish thickness, calculating a gain based on the initial signal value and the expected signal value, determining a polishing pad thickness value from the gain using a gain function, receiving signals from the in-situ monitoring system during polishing of the conductive layer to generate a plurality of measured signals for a plurality of different locations on the layer, determining a plurality of thickness values for the plurality of different locations on the layer from the plurality of measured signals, generating, for each location of at least some of the plurality of different locations, a corrected thickness value for the location to provide a plurality of corrected thickness values by processing at least some of the plurality of thickness values through a neural network, wherein the at least some of the plurality of thickness values and the polishing pad thickness value are input to the neural network and the corrected thickness values are output by the neural network, and at least one of detecting a polishing endpoint or modifying a polishing parameter based on the plurality of corrected thickness values.

In another aspect, a computer program product, tangibly embodied in a computer readable medium, has instructions for causing one or more processors to receive a value representing a polishing pad thickness, receive signals from an in-situ monitoring system during polishing of the conductive layer to generate a plurality of measured signals for a plurality of different locations on the layer, determine a plurality of thickness values for the plurality of different locations on the layer from the plurality of measured signals, generate for each location of at least some of the plurality of different locations a corrected thickness value for the location to provide a plurality of corrected thickness values by processing at least some of the plurality of thickness values through a neural network that has been trained using a plurality of tuples of a test pad thickness value, a test layer estimated thickness profile, and a test layer ground truth thickness profile, wherein the at least some of the plurality of thickness values and the polishing pad thickness value are input to the neural network and the corrected thickness values are output by the neural network, and at least one of detecting a polishing endpoint or modifying a polishing parameter based on the plurality of corrected thickness values.

In another aspect, a computer program product, tangibly embodied in a computer readable medium, has instructions for causing one or more processors to receive a value representing a polishing pad thickness, received from an in-situ monitoring system a plurality of measured signals for a plurality of different locations on a layer being polished, determine a plurality of thickness values for the plurality of different locations on the layer from the plurality of measured signals, for each location of at least some of the plurality of different locations generate a corrected thickness value for the location to provide a plurality of corrected thickness values by processing at least some of the plurality of thickness values through a neural network, and at least one of detect a polishing endpoint or modify a polishing parameter based on the plurality of corrected thickness values. The neural network includes a plurality of input nodes, a plurality of output nodes, and a plurality of intermediate nodes. At least some of the plurality of thickness values are applied to at least some of the input nodes, the value representing the polishing pad thickness is applied directly to an intermediate node from the plurality of intermediate nodes, and at least some of the plurality of output nodes output the plurality of corrected thickness values.

Certain implementations can include one or more of the following advantages. An in-situ monitoring system, e.g., an eddy current monitoring system, can generate a signal as a sensor scans across the substrate. The system can compensate for distortions in an edge portion of the signal that result from pad thickness changes, e.g., from wafer-to-wafer. The signal can be used for endpoint control and/or closed-loop control of polishing parameters, e.g., carrier head pressure, thus providing improved within-wafer non-uniformity (WIWNU) and wafer-to-wafer non-uniformity (WTWNU).

The details of one or more implementations are set forth in the accompanying drawings and the description below. Other aspects, features and advantages will be apparent from the description and drawings, and from the claims.

BRIEF DESCRIPTION OF DRAWINGS

Like reference symbols in the various drawings indicate like elements.

DETAILED DESCRIPTION

A polishing apparatus can use an in-situ monitoring system, e.g., an eddy current monitoring system, to detect the thickness of an outer layer that is being polished on a substrate. The thickness measurements can be used to trigger a polishing endpoint and/or to adjust processing parameters of the polishing process in real time. For example, a substrate carrier head can adjust the pressure on the backside of the substrate to increase or decrease the polishing rate in various zones of the outer layer. The polishing rate can be adjusted so that the zones are substantially the same thickness after polishing and/or so that polishing of the zones completes at about the same time. Such profile control can be referred to as real time profile control (RTPC).

An in-situ monitoring system can be subject to signal distortion in measurements at locations close to the substrate edge. For example, an eddy current monitoring system can generate a magnetic field. Near the substrate edge the magnetic field only partially overlaps the conductive layer of the substrate, causing the signal to be artificially low. A technique to compensate for these distortions is to feed the thickness measurement into a trained neural network.

Additionally, the signal from the eddy current monitoring system can be artificially increased as the polishing pad becomes thinner due to abrasion by the conditioning disk. As the pad thickness changes, the signal from one or more sensors that read substrate characteristics through the polishing pad can also change. In particular, as the pad becomes thinner, the distance between the substrate and the eddy current sensor will decrease. This can cause increased signal strength, which can artificially increase the apparent layer thickness, leading to inconsistency in the polishing endpoint or non-uniformity on a wafer-to-wafer basis. Even if a neural network is used, the system may not properly compensate for the distortion at the substrate edge when the signal is also dependent on the pad thickness. However, by training the neural network using layer thickness measurements corresponding to different pad thicknesses, measured thickness values of the polishing pad can be used as an input when generating modified signals with the neural network.

Figure 1A:
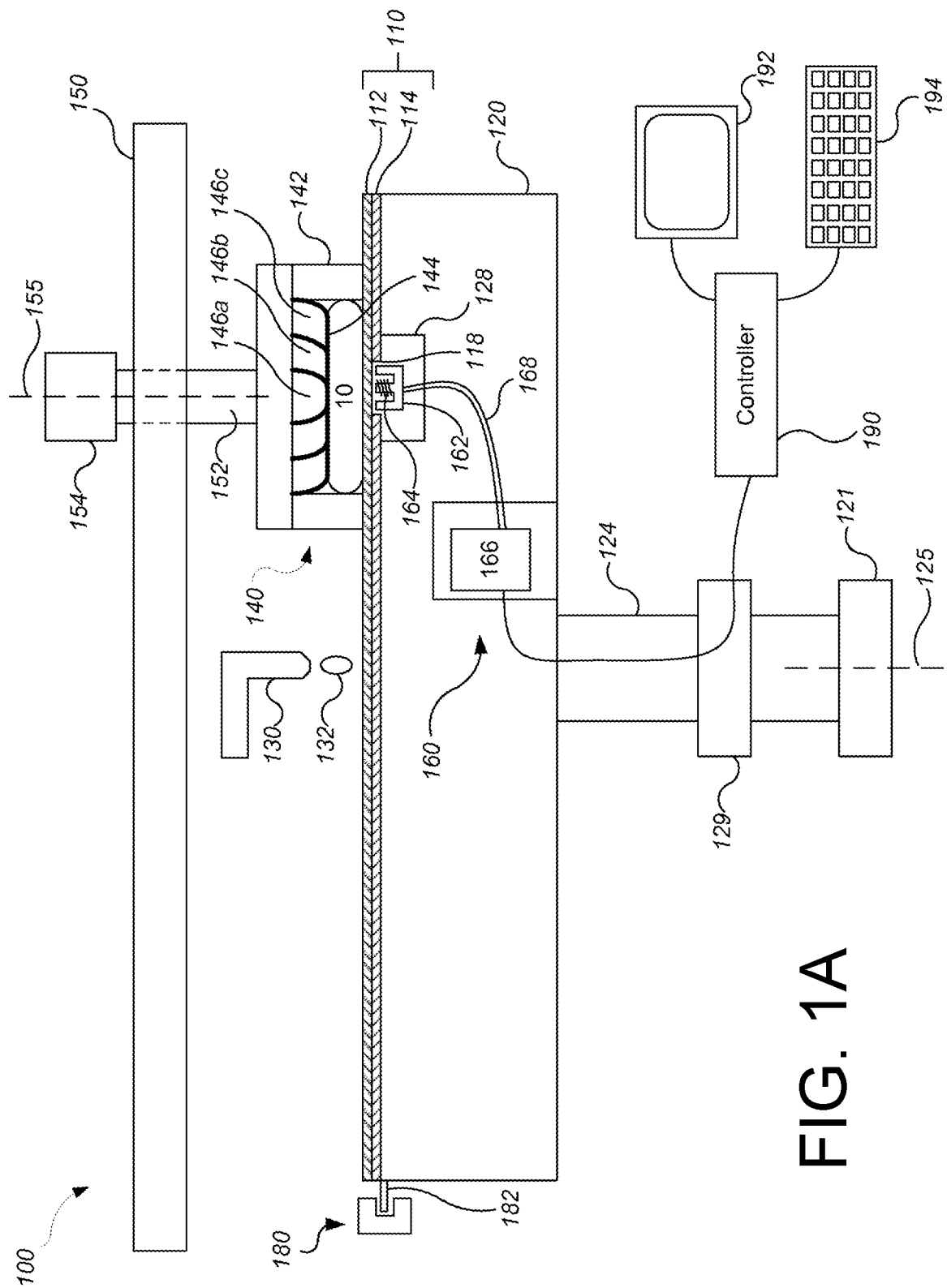
FIG. 1A is a schematic side view, partially cross-sectional, of a chemical mechanical polishing station that includes an eddy current monitoring system.
Figure 1B:
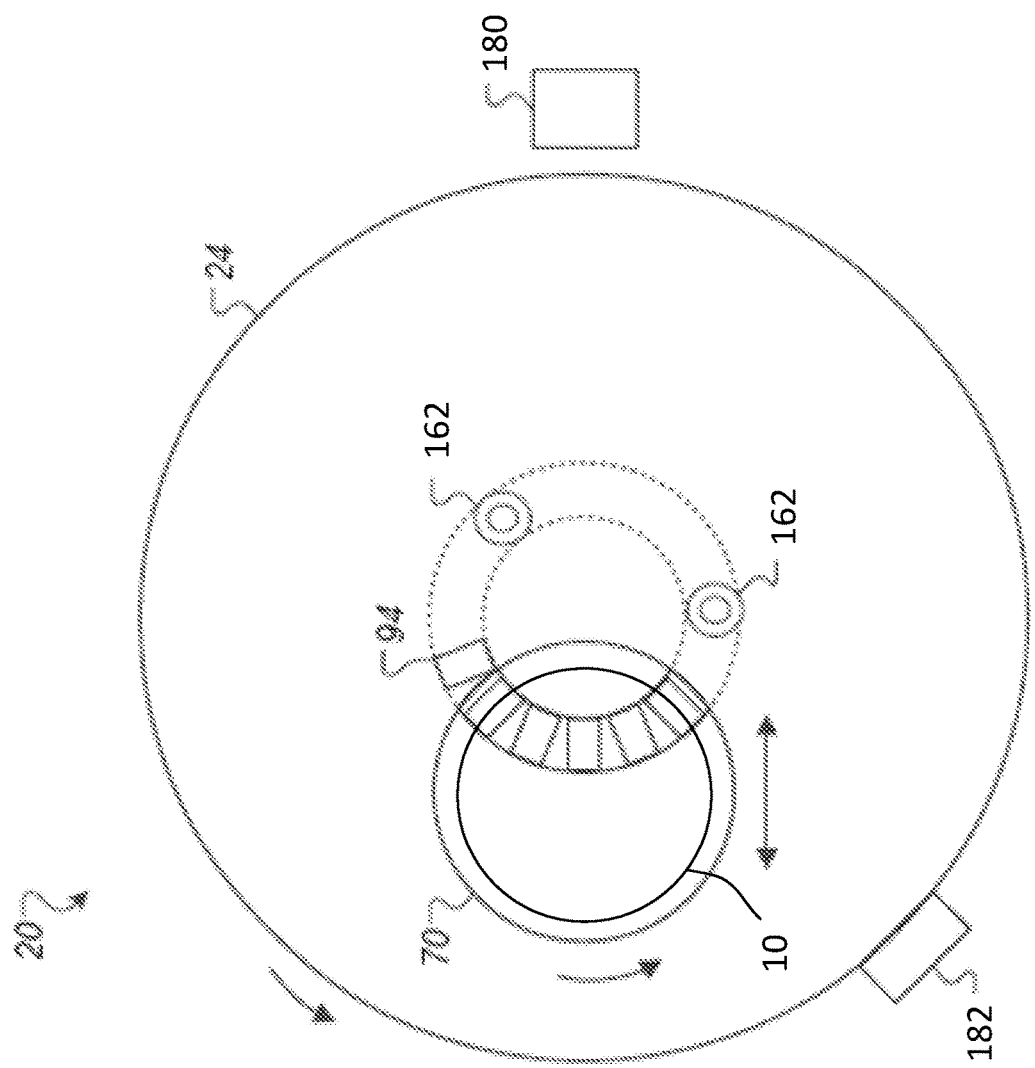
FIG. 1B is a schematic top view of a chemical mechanical polishing station.

FIGS. 1A and 1B illustrate an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110. The polishing apparatus can also include a polishing pad conditioner to abrade the polishing pad 110 to maintain the polishing pad 110 in a consistent abrasive state.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel 150 or track; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus 100 also includes an in-situ monitoring system 160. The in-situ monitoring system 160 generates a time-varying sequence of values that depend on the thickness of a layer on the substrate. The in-situ monitoring system 160 includes a sensor head at which the measurements are generated; due to relative motion between the substrate and the sensor head, measurements will be taken at different locations on the substrate.

The in-situ-monitoring system 160 can be an eddy current monitoring system. The eddy current monitoring system 160 includes a drive system to induce eddy currents in a conductive layer on the substrate and a sensing system to detect eddy currents induced in the conductive layer by the drive system. The monitoring system 160 includes a core 162 positioned in a recess 128 to rotate with the platen, at least one coil 164 wound around a portion of the core 162, and drive and sense circuitry 166 connected by wiring 168 to the coil 164. The combination of the core 162 and coil 164 can provide the sensor head. In some implementations, the core 162 projects above the top surface of the platen 120, e.g., into a recess 118 in the bottom of the polishing pad 110.

The drive and sense circuitry 166 is configured to apply an oscillating electric signal to the coil 164 and to measure the resulting eddy current. A variety of configurations are possible for the drive and sense circuitry and for the configuration and position of the coil(s), e.g., as described in U.S. Pat. Nos. 6,924,641, 7,112,960 and 8,284,560, and in U.S. Patent Publication Nos. 2011-0189925 and 2012-0276661. The drive and sense circuitry 166 can be located in the same recess 128 or a different portion of the platen 120, or could be located outside the platen 120 and be coupled to the components in the platen through a rotary electrical union 129.

In operation the drive and sense circuitry 166 drives the coil 164 to generate an oscillating magnetic field. At least a portion of magnetic field extends through the polishing pad 110 and into substrate 10. If a conductive layer is present on substrate 10, the oscillating magnetic field generates eddy currents in the conductive layer. The eddy currents cause the conductive layer to act as an impedance source that is coupled to the drive and sense circuitry 166. As the thickness of the conductive layer changes, the raw signal from the sensor head changes, and this can be detected by the drive and sense circuitry 166.

In addition, as noted above, due to the conditioning process the thickness of the polishing pad 110 can be reduced from wafer-to-wafer. As the core 162 and coil 164 can be located within the recess 128 of the polishing pad 110 and the magnetic field can extend through the outer polishing layer 112 and into the substrate 10, the distance between the core 162 and the substrate 10 decreases as the thickness of the polishing pad 110 decreases. As a result, the impedance read by the drive and sense circuitry 166 can also change as the thickness of polishing pad 110 changes.

In general, the drive and sense circuitry 166 maintain a normalized signal from the core 162 by including a gain parameter for the raw signal from the sensor head. The gain parameter can be used to scale the signal for output to the controller 190. When the outer polishing layer 112 of the polishing pad 110 is at a maximum, e.g., when the polishing pad 110 is new, the gain parameter can be a maximum value. As the thickness of the outer polishing layer 112 is reduced, the gain parameter can be decreased to compensate for the increased signal strength due to the sensor being closer to the substrate.

Alternatively or in addition, an optical monitoring system, which can function as a reflectometer or interferometer, can be secured to the platen 120 in the recess 128. If both systems are used, the optical monitoring system and eddy current monitoring system can monitor the same portion of the substrate.

The CMP apparatus 100 can also include a position sensor 180, such as an optical interrupter, to sense when the core 162 is beneath the substrate 10. For example, the optical interrupter could be mounted at a fixed point opposite the carrier head 140. A flag 182 is attached to the periphery of the platen. The point of attachment and length of flag 182 is selected so that it interrupts the optical signal of sensor 180 while the core 162 sweeps beneath substrate 10. Alternatively or in addition, the CMP apparatus can include an encoder to determine the angular position of platen.

A controller 190, such as a general purpose programmable digital computer, receives the intensity signals from the eddy current monitoring system 160. The controller 190 can include a processor, memory, and I/O devices, as well as an output device 192 e.g., a monitor, and an input device 194, e.g., a keyboard.

The signals can pass from the eddy current monitoring system 160 to the controller 190 through the rotary electrical union 129. Alternatively, the circuitry 166 could communicate with the controller 190 by a wireless signal.

Since the core 162 sweeps beneath the substrate with each rotation of the platen, information on the conductive layer thickness is accumulated in-situ and on a continuous real-time basis (once per platen rotation). The controller 190 can be programmed to sample measurements from the monitoring system when the substrate generally overlies the core 162 (as determined by the position sensor). As polishing progresses, the thickness of the conductive layer changes, and the sampled signals vary with time. The time varying sampled signals may be referred to as traces. The measurements from the monitoring systems can be displayed on the output device 192 during polishing to permit the operator of the device to visually monitor the progress of the polishing operation.

In operation, the CMP apparatus 100 can use the eddy current monitoring system 160 to determine when the bulk of the filler layer has been removed and/or to determine when the underlying stop layer has been substantially exposed. Possible process control and endpoint criteria for the detector logic include local minima or maxima, changes in slope, threshold values in amplitude or slope, or combinations thereof.

The controller 190 may also be connected to the pressure mechanisms that control the pressure applied by carrier head 140, to carrier head rotation motor 154 to control the carrier head rotation rate, to the platen rotation motor 121 to control the platen rotation rate, or to slurry distribution system 130 to control the slurry composition supplied to the polishing pad. In addition, the computer 190 can be programmed to divide the measurements from the eddy current monitoring system 160 from each sweep beneath the substrate into a plurality of sampling zones, to calculate the radial position of each sampling zone, and to sort the amplitude measurements into radial ranges, as discussed in U.S. Pat. No. 6,399,501. After sorting the measurements into radial ranges, information on the film thickness can be fed in real-time into a closed-loop controller to periodically or continuously modify the polishing pressure profile applied by a carrier head in order to provide improved polishing uniformity.

Figure 3A:
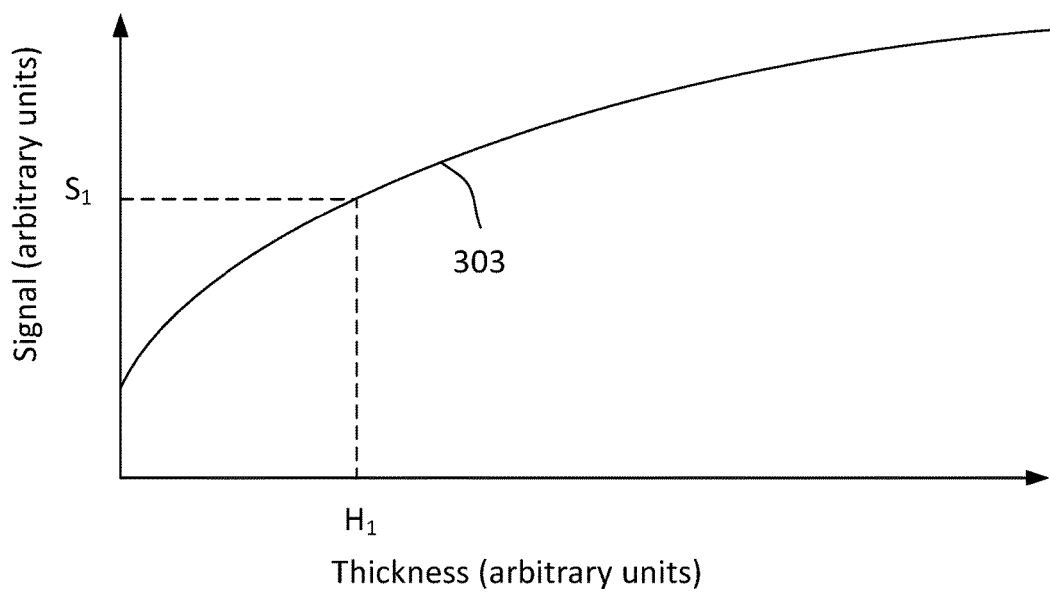
FIG. 3A is a schematic graph of a static formula for determining substrate thickness based on measured signals.

The controller 190 can use a correlation curve that relates the signal measured by the in-situ monitoring system 160 to the thickness of the layer being polished on the substrate 10 to generate an estimated measure of the thickness of the layer being polished. An example of a correlation curve 303 is shown in FIG. 3A. In the coordinate system depicted in FIG. 3A, the horizontal axis represents the value of the signal received from the in-situ monitoring system 160, whereas the vertical axis represents the value for the thickness of the layer of the substrate 10. For a given signal value, the controller 190 can use the correlation curve 303 to generate a corresponding thickness value. The correlation curve 303 can be considered a "static" formula, in that it predicts a thickness value for each signal value regardless of the time or position at which the sensor head obtained the signal. The correlation curve can be represented by a variety of functions, such as a polynomial function, or a look-up table (LUT) combined with linear interpolation.

The controller 190 can also use a gain function that relates the signal measured by the in-situ monitoring system 160 to the thickness of the polishing pad 110 to generate an estimated measure of the thickness of the substrate 10.

The gain function can be generated by measuring "raw" signals from the core 162 using a body of standard conductivity for different polishing pad thicknesses. Examples of the body can include a substrate thicker than the impedance penetration depth, or a substrate of a known, uniform thickness as measured by a four point probe. This ensures a standard expected conductivity measurement from the body. This allows for a signal from the core 162 measured at varying pad thicknesses to be scaled to a constant signal value relating to the established conductivity of the standard body. The scaling value needed to normalize a core 162 signal at a given pad thickness is the gain parameter.

For example, the core 162 signal measured for a large pad thickness and a standard substrate body can be lower than the core 162 signal measured for a small pad thickness and the same substrate. Larger pad thicknesses would reduce the measured core 162 signal in the standard body due to lower impedance penetration in the standard body. To correct for this reduction, a gain parameter can be used to scale the measured core 162 signal to a normalized value as described above. Alternatively, a smaller pad thickness could result in a lower gain parameter necessary to scale the core 162 signal to the established normalized value. Each pad thickness and correlated gain value can constitute a correlation point and more than one correlation point can establish a gain function.

Alternatively, the conductive layer thickness of a substrate 10 can be accurately measured by a separate metrology station, e.g., a four point probe, before being placed in the carrier head 140 and moved over the polishing pad 110. As polishing begins the sensor can be swept beneath the substrate 10 to get the raw signal from the core 162. Comparing this signal against the expected signal based on the measured conductive layer thickness establishes a ratio between the given and expected signals. This ratio can be used as the gain parameter by the drive and sense circuitry 166.

Figure 3B:
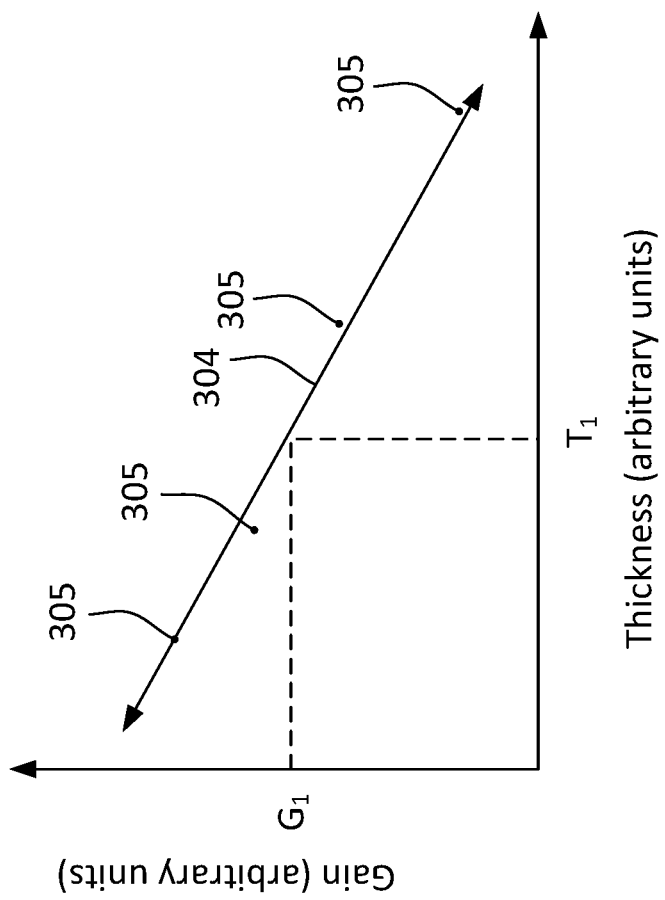
FIG. 3B is a schematic graph of a function for determining polishing pad thickness based on measured impedance signal gain.

FIG. 3B shows an example gain function 304. In the coordinate system depicted in FIG. 3B, the vertical axis represents the value of the gain parameter received from the in-situ monitoring system 160, whereas the horizontal axis can represent the value for the thickness of the outer polishing layer 112. The pad thickness and correlated gain values described above are gain function points 305 on the chart and a gain function 304 is determined from the correlation points 305.

The gain function 304 can be determined based on linear regression of ground truth measurements of polishing pad 110 thicknesses correlated with the corresponding core 162 signal measurement of the standard body. FIG. 3B depicts an example gain function 304 generated from four calibration measurements 305 which correlate polishing pad 110 thickness to gain as measured by the drive and sense circuitry 166. In general, the gain function 304 can be constructed from at least two thickness measurement points 305.

In general, to generate calibration measurements 305, a ground truth measurement of the thickness of the polishing pad 110 can be determined using accurate instrumentation outside of the system, e.g., a profilometer. This polishing pad 110 of known thickness is then placed in the polishing apparatus 100 in combination with a calibration substrate. The calibration substrate is a body having a conductive layer of consistent thickness; the same calibration substrate can be used for calibration of multiple polishing tools. The calibration substrate is loaded into the polishing system 100 and moved into position on the polishing pad 110 over the sensor head. A liquid containing no abrasive particles can be supplied to the polishing pad surface during the measurement of the calibration substrate by the in-situ monitoring system so that no polishing is performed. The drive and sense circuitry 166 can then determine the signal strength and correlate it with the ground truth measurement of the polishing pad thickness to create a calibration measurement 305. By repeating this correlation for more than one polishing pad 110 at additional thicknesses, more calibration measurements 305 can be created.

In general, the gain function 304 for the gain parameters and polishing pad 110 thickness can be determined with a regression using the calibration measurements 305. In some implementations, the correlation curve 303 can be a linear regression. In some implementations, the correlation curve 303 can be a weighted, or unweighted linear regression. For example, the weighted or unweighted linear regression can be a Deming, Theil-Sen, or Passing-Bablock linear regression. However, for some implementations, the correlation curve can be a non-linear function. The gain function 304 can then be used to interpolate estimated thickness values between two calibration measurements 305 of known gain parameters and pad thicknesses.

Once the gain function 304 has been established, the controller 190 can use the gain function 304 to generate a gain parameter value for a given pad thickness with which to scale the core 162 signal. The gain function 304 can be considered a "static" formula, in that it predicts a thickness value for each signal value regardless of the time or position at which the sensor head obtained the signal. The gain function can be represented by a variety of functions, such as a LUT combined with linear interpolation.

Figure 2:
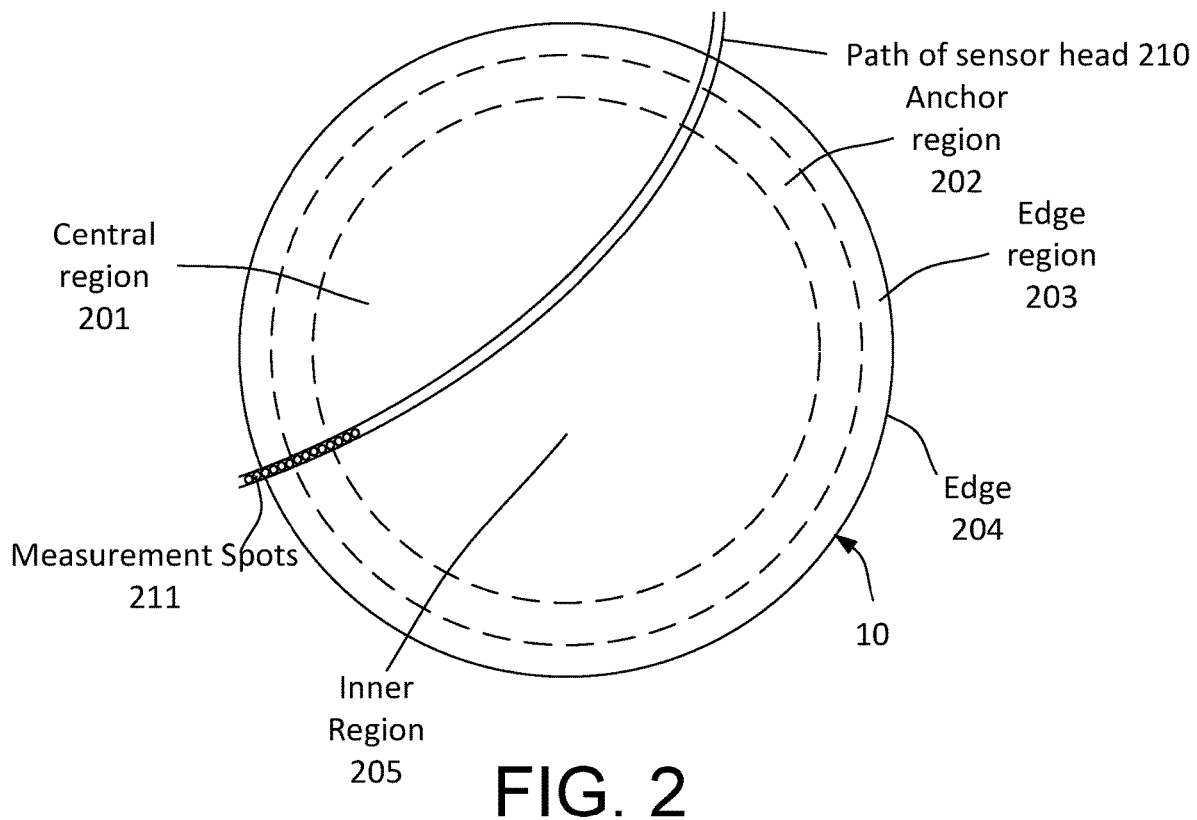
FIG. 2 is a schematic top view of a substrate being scanned by a sensor head of a polishing apparatus.

Referring to FIGS. 1B and 2, changes in the position of the sensor head with respect to the substrate 10 can result in a change in the signal from the in-situ monitoring system 160. That is, as the sensor head scans across the substrate 10, the in-situ monitoring system 160 will make measurements for multiple regions 94, e.g., measurement spots, at different locations on the substrate 10. The regions 94 can be partially overlapping (see FIG. 2).

Figure 4:
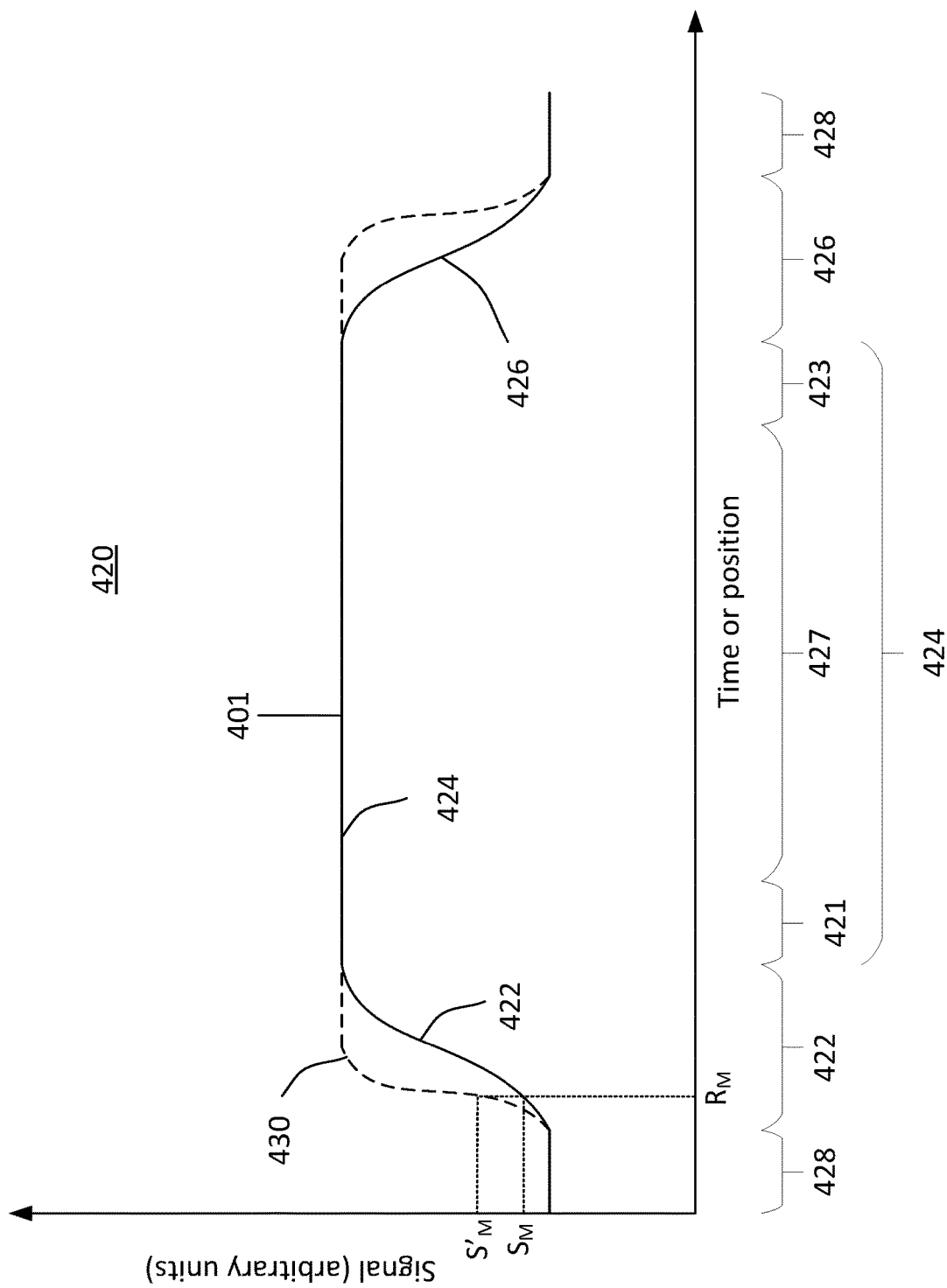
FIG. 4 is a schematic graph of measured signals obtained while monitoring locations on a substrate.

FIG. 4 illustrates a graph 420 that shows a signal profile 401 from the in-situ monitoring system 160 during a single pass of the sensor head below the substrate 10. The signal profile 401 is composed of a series of individual measurements from the sensor head as it sweeps below the substrate. The graph 420 can be a function of measurement time or of position, e.g., radial position, of the measurement on the substrate. In either case, different portions of the signal profile 401 correspond to measurement spots 94 at different locations on the substrate 10 scanned by the sensor head. Thus, the graph 420 depicts, for a given location of the substrate scanned by the sensor head, a corresponding measured signal value from the signal profile 401.

Referring to FIGS. 2 and 4, the signal profile 401 includes a first portion 422 that corresponds to locations in an edge region 203 of the substrate 10 when the sensor head crosses a leading edge of the substrate 10, a second portion 424 that corresponds to locations in a central region 201 of the substrate 10, and a third portion 426 that corresponds to locations in edge region 203 when the sensor head crosses a trailing edge of the substrate 10. The signal can also include portions 428 that correspond to off-substrate measurements, i.e., signals generated when the sensor head scans areas beyond the edge 204 of the substrate 10 in FIG. 2.

The edge region 203 can correspond to a portion of the substrate where measurement spots 94 of the sensor head overlap the substrate edge 204. The central region 201 can include an annular anchor region 202 that is adjacent the edge region 203, and an inner region 205 that is surrounded by the anchor region 202. The sensor head may scan these regions on its path 210 and generate a sequence of measurements that correspond to a sequence of locations along the path 210.

In the first portion 422, the signal intensity ramps up from an initial intensity (typically the signal resulting when no substrate and no carrier head is present) to a higher intensity. This is caused by the transition of the monitoring location from initially only slightly overlapping the substrate at the edge 204 of the substrate (generating the initial lower values) to the monitoring location nearly entirely Overlapping the substrate (generating the higher values). Similarly, in the third portion 426, the signal intensity ramps down when the monitoring location transitions to the edge 204 of the substrate.

Although the second portion 424 is illustrated as flat, this is for simplicity; a real signal in the second portion 424 would likely include fluctuations due both to noise and to variations in the layer thickness. The second portion 424 corresponds to the monitoring location scanning the central region 201. The second portion 424 includes sub-portions 421 and 423 that are caused by the monitoring location scanning the anchor region 202 of the central region 201 and sub-portion 427 that is caused by the monitoring location scanning the inner region 205 of the central region 201.

As noted above, the variation in the signal intensity in the regions 422, 426 is caused in part by measurement region of the sensor overlapping the substrate edge, rather than an intrinsic variation in the thickness or conductivity of the layer being monitored. Consequently, this distortion in the signal profile 401 can cause errors in the calculating of a characterizing value for the substrate, e.g., the thickness of the layer, near the substrate edge. To address this problem, the controller 190 can include a neural network, e.g., neural network 500 of FIG. 5, to generate a modified thickness value corresponding to one or more locations of the substrate 10 based on the computed thickness values corresponding to those locations.

Figure 5:
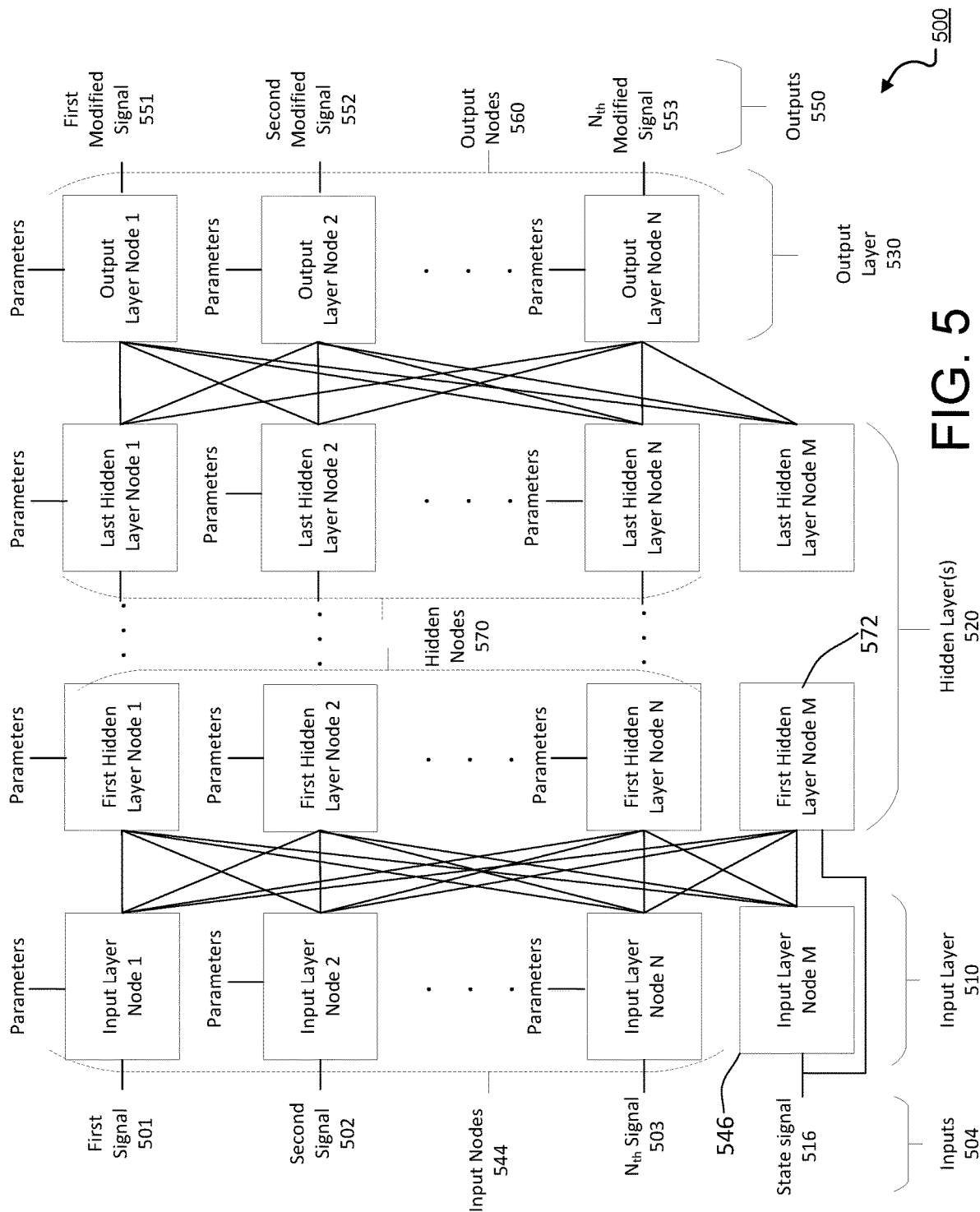
FIG. 5 is an example neural network.

Referring now to FIG. 5, the neural network 500 is configured to, when trained appropriately, generate modified thickness values that reduce and/or remove the distortion of computed thickness values near the substrate edge. The neural network 500 receives a group of inputs 504 and processes the inputs 504 through one or more neural network layers to generate a group of outputs 550. The layers of the neural network 500 include an input layer 510, an output layer 530, and one or more hidden layers 520.

Each layer of the neural network 500 includes one or more neural network nodes. Each neural network node in a neural network layer receives one or more node input values (from the inputs 504 to the neural network 500 or from the output of one or more nodes of a preceding neural network layer), processes the node input values in accordance with one or more parameter values to generate an activation value, and optionally applies a non-linear transformation function (e.g., a sigmoid or tanh function) to the activation value to generate an output for the neural network node.

Each node in the input layer 510 receives as a node input value one of the inputs 504 to the neural network 500.

The inputs 504 to the neural network include initial thickness values from the in-situ monitoring system 160 for multiple different locations on the substrate 10, such as a first thickness value 501, a second thickness value 502, through an nth thickness value 503. The initial thickness values can be individual values calculated from the sequence of signal values in the signal 401 using the correlation curve.

The input nodes 504 of the neural network 500 can also include one or more state input nodes 546 that receive one or more process state signals 516. In particular, a measure of the thickness of the polishing pad 110 can be received as a process state signal 516 at state input nodes 546.

The pad thickness can be a direct measurement of the thickness of the polishing pad 110, e.g., by a contact sensor at the polishing station. Alternatively, the thickness can be generated from the gain function 304 described above. In particular, the thickness of the conductive layer can be measured before polishing, e.g., by an in-line or stand-alone metrology system. This thickness can be converted to an expected signal value using the calibration curve 303. The expected signal value can then be compared to the actual signal value at the start of polishing of the substrate; the ratio provides the gain, which can be used to determine the pad thickness according to the gain function 304.

Assuming the neural network was trained using pad thickness as an input, the "pad wear" gain function 304 can be applied to scale the pad thickness. When applied, the pad thickness and the thickness profile (with proper gain after pad wear adjustment) are both used as input for the network to output the reconstructed edge profile at that particular pad thickness at real time.

In general, the multiple different locations include locations in the edge region 203 and the anchor region 202 of the substrate 10. In some implementations, the multiple different locations are only in the edge region 203 and the anchor region 202. In other implementations, the multiple different locations span all regions of the substrate.

The nodes of the hidden layers 520 and output layer 530 are illustrated as receiving inputs from every node of a preceding layer. This is the case in a fully-connected, feedforward neural network. However, the neural network 500 may be a non-fully-connected feedforward neural network or a non-feedforward neural network. Moreover, the neural network 500 may include at least one of one or more fully-connected, feedforward layers; one or more non-fully-connected feedforward layers; and one or more non-feedforward layers.

The neural network generates a group of modified thickness values 550 at the nodes of the output layer 530, i.e., "output nodes" 550. In some implementations, there is an output node 550 for each input thickness value from the in-situ monitoring system that is fed to the neural network 500. In this case, the number of output nodes 550 can correspond to the number of signal input nodes 504 of the input layer 510.

For example, the number of signal input nodes 544 can equal the number of measurements in the edge region 203 and the anchor region 202, there can be an equal number of output nodes 550. Thus, each output node 550 can generate a modified thickness value that corresponds to a respective initial thickness value supplied as an input to a signal input node 544, e.g., the first modified thickness value 551 for the first initial thickness value 501, the second modified thickness value 552 for the second initial thickness value 502, and the nth modified thickness value 553 for the nth initial thickness value 503.

In some implementations, the number of output nodes 550 is smaller than the number of input nodes 504. In some implementations, the number of output nodes 550 is smaller than the number of signal input nodes 544. For example, the number of signal input nodes 544 can equal the number of measurements in the edge region 203 and anchor region 202, but the number of output nodes 550 can equal the number of measurements in the edge region 203. Again, each output node 550 of the output layer 530 generates a modified thickness value that corresponds to a respective initial thickness value as a signal input node 504, e.g., the first modified thickness value 551 for the first initial thickness value 501, but only for the signal input nodes 554 that receive thickness values from the edge region 203.

In some implementations, one or more nodes in one or more of the hidden layers 520, e.g., one or more nodes 572 in the first hidden layer, can directly receive one or more state input nodes 516, such as the thickness of the polishing pad 110.

The polishing apparatus 100 can use the neural network 500 to generate modified thickness values. The modified thickness values can then be used as the determined thickness for each location in a first group of locations of a substrate, e.g., the locations in the edge region (and possibly the anchor region). For example, referring back to FIG. 4, the modified thickness values for the edge region can provide a modified portion 430 of the signal profile 401.

In some implementations, for a modified thickness value that corresponds to a given measurement location, the neural network 500 can be configured such that only input thickness values from measurement locations within a predetermined distance of that given location are used in determining the modified thickness value. For example, if thickness values $S_1, S_2, \ldots, S_M, \ldots S_N$ are received, corresponding to measurements at N successive locations on the path 210, a modified thickness value $S'_M$ for the $M^{th}$ location (indicate at $R_M$) can use only the thickness values $S_{M-L(min\ 1)}, \ldots S_M, \ldots S_{M+L(max\ N)}$ to calculate the modified thickness value $S'_M$. The value of L can be selected such that measurements that are up to about 2-4 mm apart are used to generate a given modified thickness value $S'_M$; measurements within about 1-2 mm, e.g., 1.5 mm, of the location of the measurement $S_M$ can be used. For example, L can be a number from the range 0 to 4, e.g., 1 or 2. For example, if measurements within 3 mm are used, and the spacing between measurements is 1 mm, then L can be 1; if the spacing is 0.5 mm, then L can be 2; if the spacing is 0.25 then L can be 4. However, this can depend on the configuration of the polishing apparatus and the processing conditions. Values of other parameters, e.g., pad wear, could still be used in calculating the modified thickness value $S'_M$.

For example, there can be a number of hidden nodes 570 of the one or more hidden layers 520, i.e., "hidden nodes" 570, equal to the number of signal input nodes 544, with each hidden node 570 corresponding to a respective signal input node 544. Each hidden node 570 can be disconnected from (or have a parameter value of zero for) input nodes 544 that correspond to measurements for locations greater than the predetermined distance from the location of the measurement of the corresponding input node. For example, the $M^{th}$ hidden node can be disconnected from (or have a parameter value of zero for) the $1^{st}$ through $(M-L-1)^{th}$ input nodes 544 and the $(M+L+1)^{th}$ through $N^{th}$ input nodes. Similarly, each output node 560 can be disconnected from (or have a parameter value of zero for) hidden nodes 570 that correspond to the modified signals for locations that are greater than the predetermined distance from the location of the measurement of the output node. For example, the $M^{th}$ output node can be disconnected from (or have a parameter value of zero for) the $1^{st}$ through $(M-L-1)^{th}$ hidden nodes 570 and the $(M+L+1)^{th}$ through $N^{th}$ hidden nodes.

In some embodiments, the polishing apparatus 100 can use the static formula to determine a thickness of multiple locations, e.g., locations within the edge region, of a first group of substrates. These substrates can be used to generate training data that is used to train the neural network.

Figure 6:
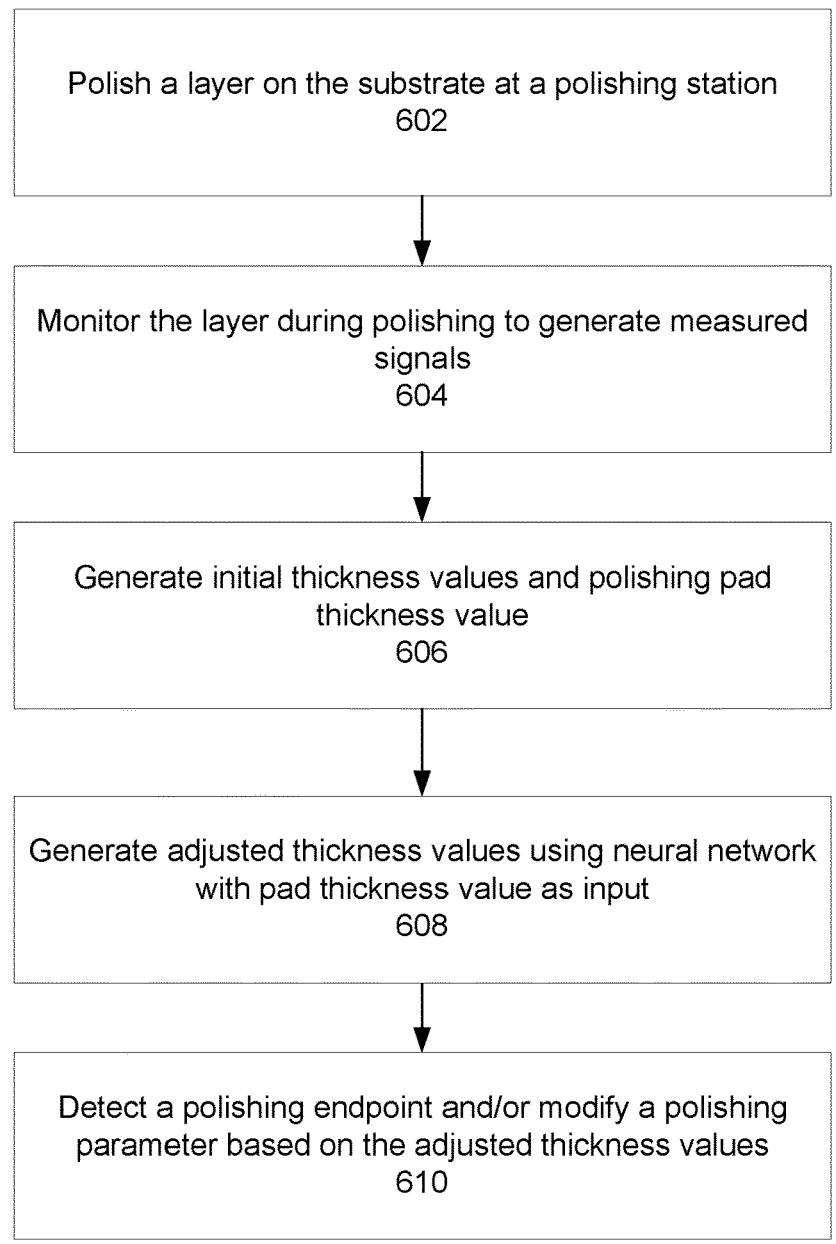
FIG. 6 is a flow diagram of an example process for polishing a substrate.

FIG. 6 is a flow-diagram of an example process 600 for polishing a substrate 10. The process 600 can be performed by the polishing apparatus 100.

The polishing apparatus 100 polishes (602) a layer on the substrate 10 and monitors (604) the layer during the polishing to generate measured signal values for different locations on the layer. The locations on the layer can include one or more locations within the edge region 203 of the substrate (corresponding to the regions 422/426 of the signal 401), and one or more locations within an anchor region 202 on the substrate (corresponding to regions 421/423 of the signal). The anchor region 202 is spaced away from the substrate edge 204 and within a central region 201 of the substrate, and thus is not affected by the distortion created by the substrate edge 204. However, the anchor region 202 can be adjacent to the edge region 203. The anchor region 202 can also surround the inner region 205 of the central region 201. The number of anchor locations can depend on the measurement spot size and measurement frequency by the in-situ monitoring system 160. In some embodiments, the number of the anchor locations cannot exceed a maximum value, such as a maximum value of 4.

The polishing apparatus 100 generates an initial thickness value for each location of the different locations from the measured signal value using the static formula (606). To a first approximation, the measured signal value is simply input to the static formula to output a thickness value. However, other processing, e.g., normalization of the signal based on the anchor region, or compensation for conductance of the particular material, can also be performed on the signal as part of generation of the initial thickness value.

The polishing apparatus 100 generates the adjusted thickness values using the neural network (608). The inputs to the neural network 500 are the initial thickness values generated by the in-situ monitoring system 160 for the different locations, and the thickness of the polishing pad as a state signal. The outputs of the neural network 500 are modified thickness values each corresponding to an input computed thickness value.

The polishing apparatus 100 detects a polishing endpoint and/or modifies a polishing parameter based on the modified thickness values (610).

Figure 7:
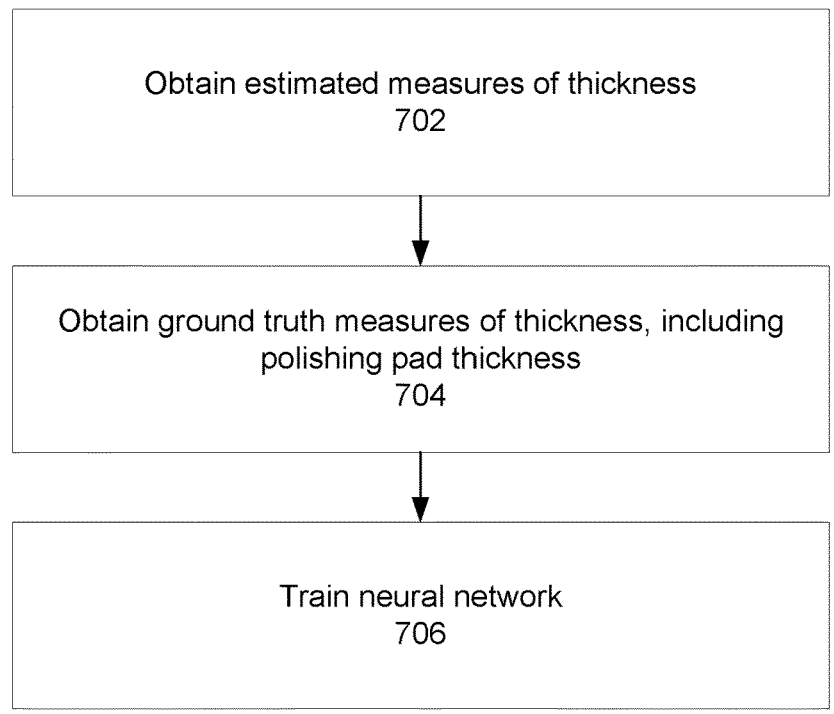
FIG. 7 is a flow diagram of an example process for training a neural network to generate modified signals for a group of measured signals.

FIG. 7 is a flow diagram of an example process 700 for training a neural network 500 to generate modified thickness values. Multiple substrates having layers with different thickness profiles are scanned by the in-situ monitoring system while being placed on polishing pads of multiple different thicknesses. The in-situ monitoring system generates estimated measures of thickness based on the calibration curve (702). For each substrate, the system also obtains (704) ground truth measures of thickness for each location in the group of locations. The system can generate ground truth measurements of the thickness using an electrical impedance measuring method, e.g., as a four point probe. The system also obtains ground truth measurements of the thickness of the polishing pad, e.g., using a profilometer.

The collected training data is applied to the neural network while the neural network is in a training mode (706). In particular, for each substrate profile, the estimated measurements of the substrate layer thickness and the polishing pad thickness are applied to the input nodes, and the ground truth measurements of the substrate layer thickness are applied to the output nodes. The training can include computation of a measure of error between the estimated measures of thickness and the ground truth measures of thickness and updates one or more parameters of the neural network 500 based on the measure of error. To do so, the system can use a training algorithm that uses gradient descent with backpropagation.

Although the discussion above has focused on thickness measurements, the techniques are applicable to other characterizing values, e.g., conductivity.

The monitoring system can be used in a variety of polishing systems. Either the polishing pad, or the carrier head, or both can move to provide relative motion between the polishing surface and the substrate. The polishing pad can be a circular (or some other shape) pad secured to the platen, a tape extending between supply and take-up rollers, or a continuous belt. The polishing pad can be affixed on a platen, incrementally advanced over a platen between polishing operations, or driven continuously over the platen during polishing. The pad can be secured to the platen during polishing, or there can be a fluid bearing between the platen and polishing pad during polishing. The polishing pad can be a standard (e.g., polyurethane with or without fillers) rough pad, a soft pad, or a fixed-abrasive pad.

Although the discussion above focuses on an eddy current monitoring system, the correction techniques can be applied to other sorts of monitoring systems, e.g., optical monitoring systems, which scan over an edge of substrate. In addition, although the discussion above focuses on a polishing system, the correction techniques can be applied to other sorts of substrate processing systems, e.g., deposition or etching systems, which include an in-situ monitoring system that scans over an edge of substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method of training a neural network, comprising:
for each test substrate of a plurality of test substrates having a different thickness profile, obtaining a ground truth thickness profile for the test substrate;
obtaining a first thickness value;
for each test substrate of the plurality of test substrates, obtaining a first measured thickness profile corresponding to the test substrate being measured by an in-situ monitoring system while on a polishing pad of a first thickness corresponding to the first thickness value;
obtaining a second thickness value;
for each test substrate of the plurality of test substrates, obtaining a second measured thickness profile corresponding to the test substrate being measured by the in-situ monitoring system while on a polishing pad of a second thickness corresponding to the second thickness value;
for each test substrate of the plurality of test substrates, generating an estimated third thickness profile for a third thickness value that is between the first thickness value and the second thickness value by interpolating between the first measured thickness profile for the test substrate and the second measured thickness profile; and
training a neural network that has a plurality of input nodes and a plurality of output nodes by, for each test substrate, applying the estimated third thickness profile to a multiplicity of input nodes from the plurality of input nodes, applying the third thickness value to an input node from the plurality of input nodes or to an intermediate node in the neural network, and applying the ground truth thickness profile to a plurality of output nodes while the neural network is in a training mode.

2. The method of claim 1, wherein obtaining the first and second thickness values include measuring a thickness of the polishing pad of the first thickness and measuring a thickness of the polishing pad of the second thickness.

3. The method of claim 2, wherein measuring thickness of the polishing pad of the first thickness and measuring thickness of the polishing pad of the second thickness comprises measuring with a profilometer.

4. The method of claim 1, wherein obtaining the first or second measured thickness profiles further includes placing the test substrate on a polishing pad of the first or second thickness and scanning the test substrate with an in-situ monitoring system.

5. The method of claim 1, wherein training the neural network further includes applying the first or second thickness and the first or second measured thickness profiles to a plurality of input nodes and the ground truth thickness profile to a plurality of output nodes while the neural network is in the training mode.

6. The method of claim 1, wherein training the neural network further includes applying a fourth thickness and an estimated fourth thickness profile to a plurality of input nodes and the ground truth thickness profile to a plurality of output nodes while the neural network is in the training mode.

7. The method of claim 1, wherein the interpolation is a linear interpolation.

8. The method of claim 1, comprising applying the third thickness value directly to the intermediate node.

9. The method of claim 1, comprising applying the third thickness value to the input node from the plurality of input nodes.

10. The method of claim 1, wherein the first measured thickness profile and the second measured thickness profile are thicknesses of a conductive layer on the test substrate.

11. The method of claim 10, wherein the in-situ monitoring system comprises an eddy current monitoring system.

12. The method of claim 10, wherein obtaining the ground truth thickness profile comprises an electrical impedance measurement.

13. The method of claim 12, wherein the electrical impedance measurement comprises measuring using a four point probe.

* * * * *